United States Patent
Chen et al.

(10) Patent No.: US 8,450,903 B2
(45) Date of Patent: May 28, 2013

(54) ELECTROSTRICTIVE COMPOSITE, METHOD FOR MAKING THE SAME AND ELECTROTHERMIC TYPE ACTUATOR

(75) Inventors: Lu-Zhuo Chen, Beijing (CN);
Chang-Hong Liu, Beijing (CN);
Hong-Jiang Li, Beijing (CN);
Shou-Shan Fan, Beijing (CN)

(73) Assignees: Tsinghua University, Beijing (CN);
Hon Hai Precision Industry Co., Ltd., New Taipei (TW)

( * ) Notice: Subject to any disclaimer, the term of this patent is extended or adjusted under 35 U.S.C. 154(b) by 470 days.

(21) Appl. No.: 12/497,745

(22) Filed: Jul. 6, 2009

(65) Prior Publication Data

US 2010/0213790 A1    Aug. 26, 2010

(30) Foreign Application Priority Data

Feb. 24, 2009    (CN) .......................... 2009 1 0105807

(51) Int. Cl.
*H01L 41/08*    (2006.01)
(52) U.S. Cl.
USPC .......................................... 310/311; 310/800
(58) Field of Classification Search
USPC .......... 310/306, 307, 322, 331, 800; 977/732, 977/733, 742; 60/527
See application file for complete search history.

(56) References Cited

U.S. PATENT DOCUMENTS

| | | | | |
|---|---|---|---|---|
| 6,087,638 A * | 7/2000 | Silverbrook | ................. | 219/540 |
| 6,161,382 A * | 12/2000 | Brotz | .............................. | 60/528 |
| 6,376,971 B1 * | 4/2002 | Pelrine et al. | ................. | 310/363 |
| 6,545,391 B1 * | 4/2003 | Su et al. | ......................... | 310/332 |
| 6,685,303 B1 * | 2/2004 | Trauernicht et al. | ............ | 347/54 |
| 6,812,624 B1 * | 11/2004 | Pei et al. | ......................... | 310/309 |
| 6,960,864 B2 * | 11/2005 | Urano et al. | ................... | 310/307 |
| 7,030,542 B2 * | 4/2006 | Chisaka et al. | ................ | 310/358 |
| 7,836,564 B2 * | 11/2010 | Barvosa-Carter et al. | ...... | 24/442 |
| 8,253,300 B2 * | 8/2012 | Liu et al. | ....................... | 310/311 |
| 2006/0261709 A1 * | 11/2006 | Kato et al. | .................... | 310/367 |
| 2007/0241641 A1 * | 10/2007 | Kato et al. | .................... | 310/332 |
| 2007/0295714 A1 * | 12/2007 | Liu et al. | ....................... | 219/553 |
| 2008/0136052 A1 | 6/2008 | Pelrine et al. | | |
| 2010/0213790 A1 * | 8/2010 | Chen et al. | .................... | 310/307 |
| 2011/0012476 A1 * | 1/2011 | Chen et al. | .................... | 310/300 |
| 2011/0094217 A1 * | 4/2011 | Chen et al. | ........................ | 60/528 |

FOREIGN PATENT DOCUMENTS

| | | | |
|---|---|---|---|
| JP | H05-4312 A | | 1/1993 |
| JP | 11-241903 | | 9/1999 |
| JP | 2006204099 | * | 8/2006 |
| KR | 10-20080102888 | | 11/2008 |

OTHER PUBLICATIONS

Ray H. Baughman, et al., Carbon Nanotube Actuators, Science, V284, p. 1340-1344 (1999).

(Continued)

*Primary Examiner* — Tran Nguyen
*Assistant Examiner* — Thomas Truong
(74) *Attorney, Agent, or Firm* — Altis Law Group, Inc.

(57) ABSTRACT

An electrostrictive composite includes a first material layer and a second material layer. The first material layer and the second material layer are stacked to each other. The thermal expansion coefficients of the first material layer and the second material layer are different. The first material layer includes a polymer matrix and a plurality of carbon nanotubes dispersed therein. Also an electrothermic type actuator using the electrostrictive composite is provided.

18 Claims, 3 Drawing Sheets

OTHER PUBLICATIONS

Lu-Zhuo Chen et al., Electrothermal Actuation Based on Carbon Nanotube Network in Silicon Elastomer, Applied Physics Letters V92, P263104 (2008).

Yi-Ning Kuang et al., Advance in Microactuators Based on Thermal Expansion Effect, Journal of Electron Devices V22, No. 3 p. 162-170 (1999) Abstract may be relevant.

"Preparation and Application of High Strength Carbon Nanotubes/Polymer Composites", Xue wei et al., Jiangsu Chemical Industry, vol. 35, No. 3, 2007, 1-6.

Carbon Nanotube Actuators, Ray H. Baughman et al., May 21, 1999 vol. 284, Science.

\* cited by examiner

ELECTROSTRICTIVE COMPOSITE, METHOD FOR MAKING THE SAME AND ELECTROTHERMIC TYPE ACTUATOR

RELATED APPLICATIONS

This application is related to copending applications entitled "ELECTROSTRICTIVE COMPOSITE AND METHOD FOR MAKING THE SAME", filed Jun. 10, 2009 with U.S. patent application Ser. No. 12/482,040; "ELECTROSTRICTIVE COMPOSITE AND METHOD FOR MAKING THE SAME", filed Jun. 10, 2009 with U.S. patent application Ser. No. 12/482,058. The disclosures of the above-identified applications are incorporated herein by reference.

BACKGROUND

1. Technical Field

The present disclosure relates to an electrostrictive composite, a method for making the same and an electrothermic type actuator using the same.

2. Description of Related Art

An actuator is a device that converts input energy to mechanical output energy. Usually, actuators can be classified into electrostatic, electromagnetic, and electrothermic type actuators.

An electrothermic type actuator according to a prior art usually has a double-layer structure. The electrothermic type actuator includes two metallic layers having different thermal expansion coefficients. When a current is applied, the electrothermic type actuator may bend because the thermal expansion coefficients of the two metallic layers are different. However, the electrothermic type actuator has a slow thermal response because the flexibility of the metallic layer is relatively poor.

What is needed, therefore, is to provide an electrostrictive composite having a relatively high speed on thermal response and a method for making the same, and an electrothermic type actuator using the same.

BRIEF DESCRIPTION OF THE DRAWINGS

Many aspects of the present electrostrictive composite and method for making the same, and an electrothermic type actuator using the same can be better understood with reference to the following drawings. The components in the drawings are not necessarily drawn to scale, the emphasis instead being placed upon clearly illustrating the principles of the present electrostrictive composite and method for making the same, and an electrothermic type actuator using the same.

Figure 1:
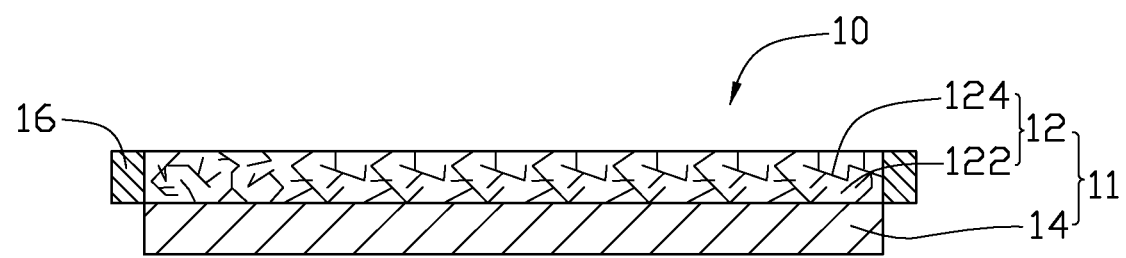
FIG. 1 is a schematic view of an electrothermic type actuator, in accordance with a present embodiment.

Corresponding reference characters indicate corresponding parts throughout the several views. The exemplifications set out herein illustrate at least one embodiment of the present electrostrictive composite and method for making the same, and an electrothermic type actuator using the same, in at least one form, and such exemplifications are not to be construed as limiting the scope of the disclosure in any manner.

DETAILED DESCRIPTION

References will now be made to the drawings to describe, in detail, various embodiments of the present electrostrictive composite and method for making the same, and an electrothermic type actuator using the same.

Referring to FIG. 1, an electrothermic type actuator 10 according to a present embodiment is shown. The electrothermic type actuator 10 includes an electrostrictive composite 11 and at least two electrodes 16. The electrostrictive composite 11 includes a first material layer 12 and a second material layer 14. The first material layer 12 and the second material layer 14 are stacked onto each other by hot press or via an adhesive. The thermal expansion coefficients of the first material layer 12 and the second material layer 14 are different.

A thickness of the electrostrictive composite 11 is arbitrary, and can be selected according to practice use. A thickness of the electrostrictive composite 11 can range from about 20 micrometers to about 2 millimeters. A thickness and shape of the first material layer 12 and the second material layer 14 are substantially the same. A thickness of the first material layer 12 can range from about 500 micrometers to about 1.5 millimeters. A thickness of the second material layer 14 can range from about 500 micrometers to about 1.5 millimeters. In one embodiment, a thickness of both the first material layer 12 and the second material layer 14 is 1 millimeter.

The first material layer 12 includes a polymer matrix 122 and a plurality of carbon nanotubes 124 dispersed therein. The carbon nanotubes 124 can be dispersed in disorderly fashion in the polymer matrix 122. In addition, the carbon nanotubes 124 dispersed in the polymer matrix 122 contact each other to form a conductive network, thus the first material layer 12 is conductive. The conductive network is electrically connected to the two electrodes 16.

A weight percentage of the carbon nanotubes 124 in the first material layer 12 can range from about 0.1% to about 8%. In one embodiment, a weight percentage of the carbon nanotubes 124 in the first material layer 12 ranges from about 0.5% to about 2%. The carbon nanotubes 124 can be selected from the group consisting of single-walled carbon nanotubes, double-walled carbon nanotubes, multi-walled carbon nanotubes, and combinations thereof. Lengths of the carbon nanotubes 124 can be greater than about 1 micrometer. The lengths of the carbon nanotubes 124 range from about 50 micrometers to about 900 micrometers in one embodiment. The carbon nanotubes 124 are flexible and have excellent heat-electricity conversion efficiency. Once a voltage is applied to the first material layer 12, the carbon nanotubes conductive network will rapidly heat the polymer matrix 122, that can lead to an expansion of the polymer matrix 122.

The polymer matrix 122 in the first material layer 12 is made of a flexible material such as conductive polymer or non-conductive polymer. The conductive polymer can be selected from the group consisting of polyaniline, polypyrrole, polythiophene and combinations thereof. The non-conductive polymer can be selected from the group consisting of silicone elastomer, polyester, polyurethane, epoxy resin, polymethyl methacrylate (PMMA), poly(ethyl acrylate), poly(butyl acrylate), polystyrene, poly(butadiene), polyacrylonitrile and combinations thereof. A weight percentage of the polymer matrix 122 in the first material layer 12 ranges from about 92% to about 99.9%. In one embodiment, the polymer matrix 122 is polymethyl methacrylate with a weight percentage of 98.5%, and the carbon nanotubes 124 are multi-walled carbon nanotubes with a weight percentage of 1.5%.

In other embodiments, the first material layer 12 can further include a plurality of reinforcing particles (not shown) dispersed therein. The reinforcing particles can be made of material selected from the group consisting of ceramic, metal, metal oxide, metal nitride, glass and combinations thereof.

An effective diameter of the reinforcing particles can range from about 1 nanometer to about 10 micrometers. A weight percentage of the reinforcing particles in the first material layer 12 can range from about 1% to about 5%. The reinforcing particles can reduce the thermal response time of the first material layer 12 by virtue of its high thermal conductance. The reinforcing particles can enhance the Young's modulus of the first material layer 12 and raise the power capability of propellant in the process of expanding.

In other embodiments, the first material layer 12 can further include a plurality of bubbles (not shown) dispersed therein. The bubbles are a plurality of sealed spaces filled with gas. The bubbles are dispersed in the polymer matrix 122 uniformly. The gas is arbitrary and sealed in the spaces. An effective diameter of the bubbles can range from about 1 nanometer to about 10 micrometers. A volume percentage of the bubbles can range from about 2% to about 50%. In one embodiment, the volume percentage of the bubbles can range from about 5% to about 20%. Because the bubbles can expand under heating obviously, therefore a little temperature rising could result in a large expanding of the polymer matrix 122. Thus, the thermal expansion coefficient of the first material layer 12 is raised.

The second material layer 14 includes a polymer matrix. The polymer matrix of the second material layer 14 can be made of polymer selected from the group consisting of polyaniline, polypyrrole, polythiophene, silicone elastomer, polyester, polyurethane, epoxy resin, polymethyl methacrylate, poly(ethyl acrylate), poly(butyl acrylate), poly styrene, poly(butadiene), polyacrylonitrile and combinations thereof. The material of the polymer matrix of the second material layer 14 should be different from that of the first material layer 12. In one embodiment, the second material layer 14 is made of silicone elastomer. The thermal expansion coefficient of the silicone elastomer in the second material layer 14 is different from that of polymethyl methacrylate in the first material layer 12.

In another embodiment, the second material layer 14 can include a plurality of carbon nanotubes (not shown) dispersed therein. Furthermore, the second material layer 14 can further include a plurality of reinforcing particles (not shown) and/or a plurality of bubbles (not shown) dispersed therein. When the second material layer 14 includes a plurality of reinforcing particles and/or a plurality of bubbles, the polymer matrix of the second material layer 14 can be the same as the first material layer 12 as long as the thermal expansion coefficients of the first material layer 12 and the second material layer 14 are different.

The at least two electrodes 16 are separately located and electrically connected to the carbon nanotubes conductive network in the first material layer 12. In one embodiment, two electrodes 16 are separately located on and electrically connected to two ends of the first material layer 12. The electrodes 16 can be made of material selected from the group consisting of metal, alloy, conductive resin, indium-tin oxide (ITO), conductive adhesive, carbon nanotube, carbon grease and any other suitable materials. The shapes of the electrodes 16 are arbitrary. In one embodiment, the electrodes 16 are two copper sheets. In other embodiments, the electrodes 16 are two copper wires.

Figure 2:
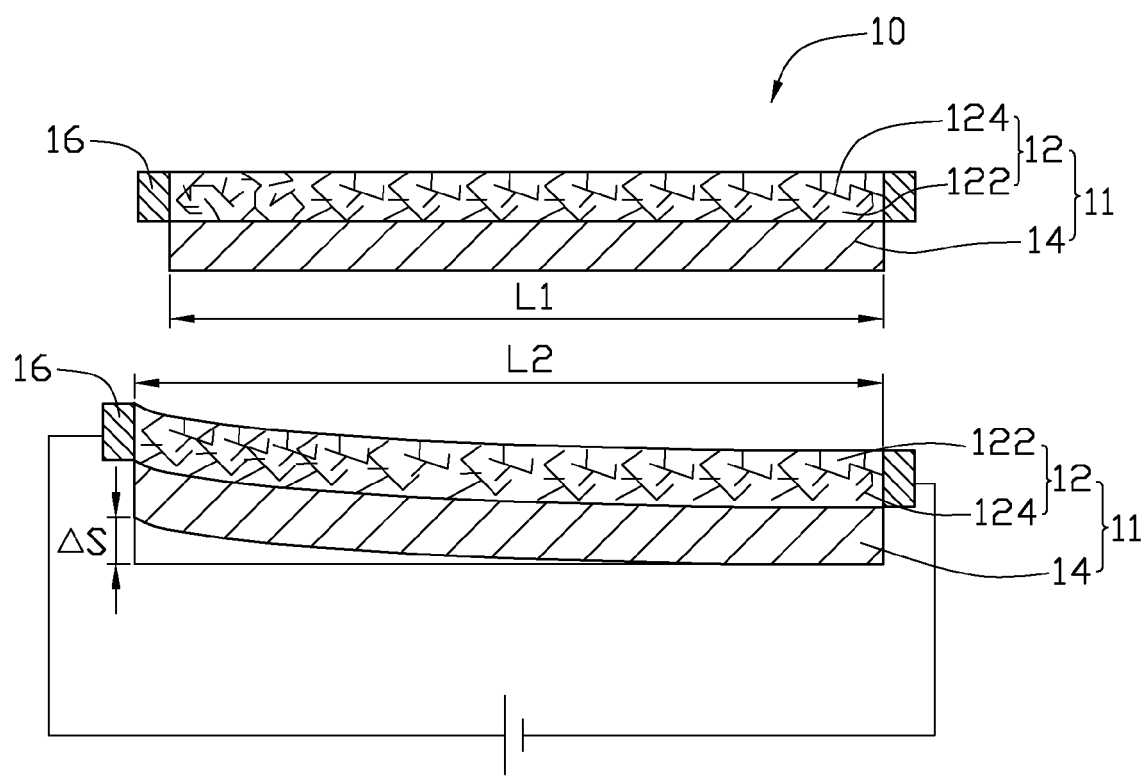
FIG. 2 is a schematic view of an electrothermic type actuator of FIG. 1 before and after bending.

Referring to FIG. 2, the work principle of the electrothermic type actuator 10 is described as follows. When a voltage is applied to the first material layer 12 via the two electrodes 16, a current gets through the carbon nanotube conductive network. The carbon nanotubes 124 convert the electric energies to heat energies, heating the first material layer 12 and the second material layer 14. That can allow the first material layer 12 and the second material layer 14 to expand along its length from one electrode 16 to the other one. Because the thermal expansion coefficients of the first material layer 12 and the second material layer 14 are different so the electrothermic type actuator 10 bend to a material layer with a smaller thermal expansion coefficient. Also an expanding of the first material layer 12 and the second material layer 14 along its width perpendicular to the current direction can be leaded.

The expansion coefficient of the electrostrictive composite 11 with an original length L1 of 5 centimeters is tested. The length L2 of the electrostrictive composite 11 increases to 5.25 centimeters after a voltage of 40 V is supplied to the electrostrictive composite 11 for about 2 minutes. The displacement $\Delta S$ as shown in FIG. 2 is about 2.5 millimeters.

Figure 3:
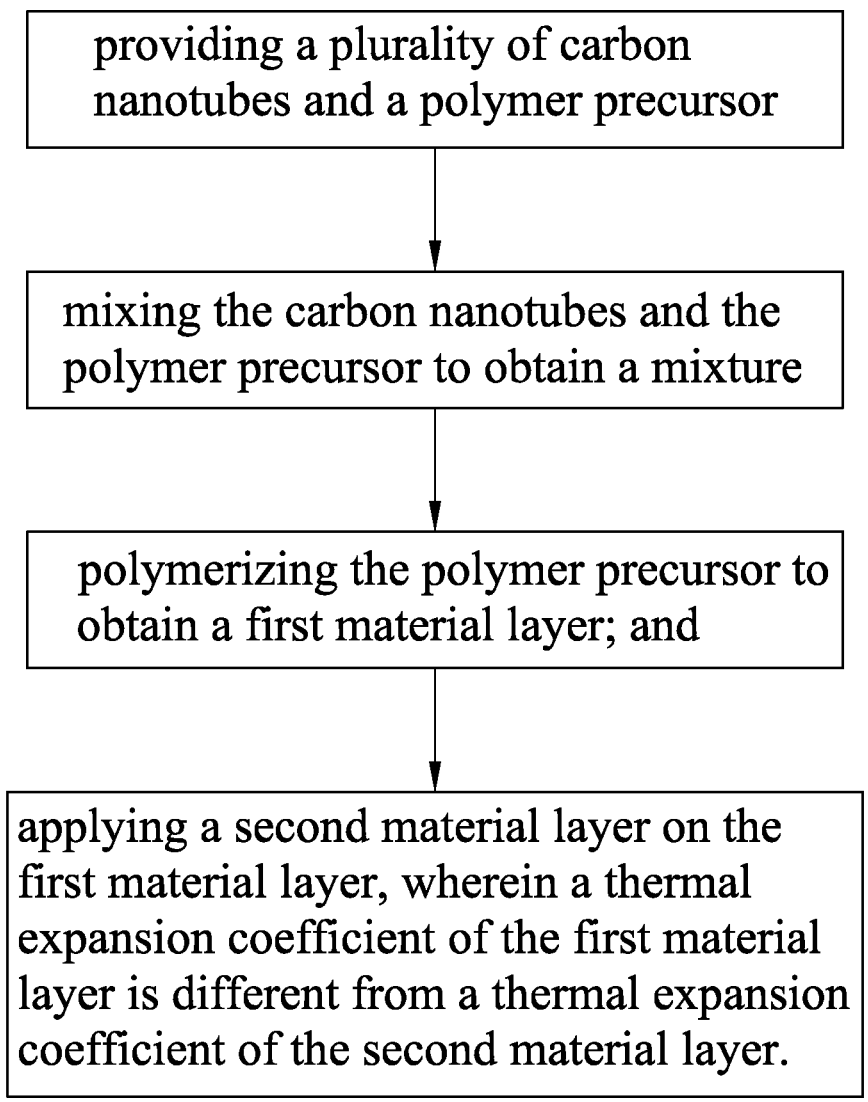
FIG. 3 is a flow chart of a method for making electrostrictive composite, in accordance with a present embodiment.

Referring to FIG. 3, a method of making the electrostrictive composite includes the following steps of: (a) providing a plurality of carbon nanotubes and a polymer precursor; (b) mixing the carbon nanotubes and the polymer precursor to obtain a mixture; (c) polymerizing the polymer precursor to obtain a first material layer; and (d) applying a second material layer on the first material layer, wherein a thermal expansion coefficient of the first material layer is different from a thermal expansion coefficient of the second material layer.

In step (a), the carbon nanotubes can be obtained by a conventional method selected from the group consisting of chemical vapor deposition (CVD), arc discharging, and laser ablation. In one embodiment, the carbon nanotubes are obtained by the following substeps of: providing a substrate; forming a carbon nanotube array on the substrate by a chemical vapor deposition method; peeling the carbon nanotube array off the substrate by a mechanical method, thereby achieving a plurality of carbon nanotubes. The carbon nanotubes in the carbon nanotube array can be substantially parallel to each other.

The polymer precursor generally includes a prepolymer or a monomer solution. The prepolymer can be selected from the group consisting of silicone elastomer prepolymer, polyester prepolymer, polyurethane prepolymer, epoxy resin prepolymer, PMMA prepolymer and combination thereof. The monomer solution can be selected from the group consisting of methyl methacrylate (MMA), ethyl acrylate, butyl acrylate, styrene, butadiene, acrylonitrile and combinations thereof. In one embodiment, the polymer precursor is methyl methacrylate monomer solution.

In step (b), a first liquid mixture is obtained. Step (b) can include the substeps of: (b1) mixing the carbon nanotubes and the monomer to obtain a first liquid mixture, a weight percentage of the monomer in the first liquid mixture can range from about 92% to about 99.9%, and a weight percentage of the carbon nanotubes in the first liquid mixture can range from about 0.1% to about 8%; and (b2) ultrasonically agitating the first liquid mixture to disperse the carbon nanotubes in the monomer solution uniformly. When the monomer solution is volatilizable, a certain mount of the monomer solution should be supplemented into the first liquid mixture after the ultrasonic agitation.

Step (b) can further include a step of adding a plurality of reinforcing particles into the liquid mixture. The reinforcing particles can be made by sol-gel or ball milling.

A step (e) of ball milling the first liquid mixture can be performed before the step (c) to reduce the size of the carbon nanotubes so as to better disperse the carbon nanotubes in the monomer solution. The time of ball milling can be in a range from about 1 hour to about 5 hours. In one embodiment, the first liquid mixture is ball milled for 3 hours.

In step (c), the polymer precursor can be polymerized by the method selected from the group consisting of condensation polymerization, polyaddition reaction, free-radical polymerization, anionic polymerization, cationic polymerization and combinations thereof.

In one embodiment, step (c) includes the substeps of: (c1) adding initiator into the first liquid mixture to obtain a second liquid mixture; (c2) pre-polymerizing the second liquid mixture to obtain a first liquid prepolymer mixture; and (c3) polymerizing the first liquid prepolymer mixture to form a first material layer comprising a first polymer matrix and a plurality of carbon nanotubes dispersed therein.

In step (c1), the initiator is selected based upon the monomer solution and can be selected from the group consisting of azobisisbutyronitrile (AIBN), benzoyl peroxideand (BPO) and combinations thereof. In one embodiment, the initiator is azobisisbutyronitrile. A weight percentage of the initiator in the first liquid mixture can range from about 0.02% to about 2%.

Furthermore, a certain mount of plasticizing agent can be added into the second liquid mixture in step (c1). The plasticizing agent is related to the first monomer solution and can be selected from the group consisting of dibutyl phthalate (DBP), hexadecyl trimethyl ammonium bromide, polymethacrylic acid salt, C12-18 fatty acids, silane coupler, titanate coupler, aluminate coupling agent and combinations thereof. In one embodiment, the plasticizing agent is dibutyl phthalate. A weight percentage of the plasticizing agent in the second liquid mixture can range from about 0% to about 5%.

Step (c2) includes the substeps of: (c21) pre-polymerizing the second liquid mixture by heating and agitating to form a first liquid prepolymer mixture; and (c22) cooling the first liquid prepolymer mixture. In one embodiment, the second liquid mixture is heated to 92° C. and agitated for 10 minutes to form a glycerin-like first liquid prepolymer mixture. Then the glycerin-like first liquid prepolymer mixture is cooled in air.

In step (c3), the first liquid prepolymer mixture is placed in a container and polymerized by heating to form a first material layer. Firstly, the first liquid prepolymer mixture can be heated to a temperature in a range from about 50° C. to about 60° C. to polymerize for a time period of about 1 hour to about 4 hours. Secondly, the first liquid prepolymer mixture can be heated to a temperature in a range from about 70° C. to about 100° C. to polymerize completely.

The first material layer can be further dipped in water for a period of about 2 minutes. The temperature of the water can be in a range from about 50° C. to about 60° C. Then, the first material layer can be peeled off from the container.

Step (c) can further include a step of adding blowing agent in the second liquid mixture or the first liquid prepolymer mixture. The blowing agent includes material selected from the group consisting of n-Pentane, n-Hexane, n-Heptane, petroleum ether, ethanol, dichlorodifuoromethane, dichlorotetrafluoroethane, glycerin and combinations thereof. The blowing agent can be add into the liquid mixture with the initiator together, before adding the initiator or after adding the initiator.

In step (d), the second material layer can be directly formed on the first material layer. Step (d) can include the substeps of: (d1) forming a layer of polymer precursor; and (d2) polymerizing the layer of polymer precursor to form a second material layer. The second material layer contact with the first material layer closely by directly forming the second material layer on the first material layer. Thus, the thermal-resistance between the first material layer and the second material layer is decreased.

In step (d1), a plurality of reinforcing particles can be introduced in the polymer precursor. In step (d2), blowing agent can be added in the polymer precursor.

In one embodiment, the polymer precursor includes a component A and a component B of the GF-T2A silicone elastomer. A weight ratio of the component A and the component B can be in a range from about 100:4 to about 100:8. The component A is hydroxyl terminated polydimethylsiloxane and the component B is tetraethoxysilane.

Alternatively step (d) can further comprise securing a prepared second material layer on the first material layer by hot press or via an adhesive. The polymer matrix of the second material layer can be made of polymer selected from the group consisting of polyaniline, polypyrrole, polythiophene, silicone elastomer, polyester, polyurethane, epoxy resin, polymethyl methacrylate, poly(ethyl acrylate), poly(butyl acrylate), poly styrene, poly(butadiene), polyacrylonitrile and combinations thereof.

Furthermore, an electrothermic type actuator can be obtained by forming two electrodes on two ends of the electrostrictive composite. The two electrodes can be fixed and connected to the electrostrictive composite via an adhesive.

It is to be understood that the above description and the claims drawn to a method may include some indication in reference to certain steps. However, the indication used is only to be viewed for identification purposes and not as a suggestion as to an order for the steps.

Finally, it is also to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An electrostrictive composite, the electrostrictive composite comprising:
a first material layer comprising a polymer matrix having a plurality of carbon nanotubes and a plurality of reinforcing particles dispersed therein, wherein the plurality of reinforcing particles are made of material selected from the group consisting of ceramic, metal, metal oxide, metal nitride, glass and combinations thereof, and the first material layer further comprises a plurality of bubbles adapted to expand upon heating; and
a second material layer attached to the first material layer, a thermal expansion coefficient of the second material layer being different from a thermal expansion coefficient of the first material layer.

2. The electrostrictive composite of claim 1, wherein a weight percentage of the carbon nanotubes in the first material layer ranges from about 0.1% to about 8%.

3. The electrostrictive composite of claim 1, wherein the plurality of carbon nanotubes cooperatively form an electrically conductive network.

4. The electrostrictive composite of claim 1, wherein the polymer matrix is made of a conductive polymer.

5. The electrostrictive composite of claim 1, wherein the polymer matrix is made of polymer selected from the group consisting of polyaniline, polypyrrole, polythiophene, silicone elastomer, polyester, polyurethane, epoxy resin, polymethyl methacrylate, poly(ethyl acrylate), poly(butyl acrylate), poly styrene, poly(butadiene), polyacrylonitrile and combinations thereof.

6. The electrostrictive composite of claim 1, wherein the second material layer comprises a polymer matrix.

7. The electrostrictive composite of claim 6, wherein the second material layer further comprises a plurality of reinforcing particles dispersed therein.

8. The electrostrictive composite of claim 6, wherein the second material layer further comprises a plurality of bubbles defined therein.

9. The electrostrictive composite of claim 1, wherein diameters of the plurality of bubbles range from about 1 nanometer to about 10 micrometers.

10. The electrostrictive composite of claim 1, wherein a volume percentage of the plurality of bubbles ranges from about 2% to about 50%.

11. The electrostrictive composite of claim 1, wherein the plurality of bubbles are dispersed in the polymer matrix uniformly.

12. The electrostrictive composite of claim 1, wherein diameters of the plurality of reinforcing particles range from about 1 nanometer to about 10 micrometers.

13. The electrostrictive composite of claim 1, wherein a weight percentage of the plurality of reinforcing particles in the first material layer range from about 1% to about 5%.

14. An electrothermic type actuator, the electrothermic type actuator comprising:
a first material layer comprising a polymer matrix having a plurality of carbon nanotubes and a plurality of reinforcing particles dispersed therein, wherein the plurality of reinforcing particles are made of material selected from the group consisting of ceramic, metal, metal oxide, metal nitride, glass and combinations thereof, and the first material layer further comprises a plurality of bubbles adapted to expand upon heating;
a second material layer in contact with the first material layer, a thermal expansion coefficient of the second material layer being different from a thermal expansion coefficient of the first material layer; and
at least two electrodes electrically connected to the first material layer.

15. The electrothermic type actuator of claim 14, wherein the plurality of carbon nanotubes cooperatively form an electrically conductive network.

16. The electrothermic type actuator of claim 15, wherein the at least two electrodes are electrically connected to the electrically conductive network.

17. The electrothermic type actuator of claim 14, wherein diameters of the plurality of bubbles range from about 1 nanometer to about 10 micrometers.

18. The electrothermic type actuator of claim 14, wherein a volume percentage of the plurality of bubbles range from about 2% to about 50%.

* * * * *